(12) United States Patent
Takada (10) Patent No.: US 11,272,769 B2
(45) Date of Patent: Mar. 15, 2022

(54) PORTABLE TERMINAL COVER FOR SURROUNDING A PORTABLE TERMINAL AND A PORTABLE TERMINAL CASE OR OTHER RETAINER IN AN INTEGRATED MANNER

(71) Applicant: Ken Takada, Yamagata (JP)

(72) Inventor: Ken Takada, Yamagata (JP)

(73) Assignee: Ken Takada, Tendo (JP)

( * ) Notice: Subject to any disclaimer, the term of this patent is extended or adjusted under 35 U.S.C. 154(b) by 0 days.

(21) Appl. No.: 16/322,197

(22) PCT Filed: Sep. 11, 2017

(86) PCT No.: PCT/JP2017/032618
§ 371 (c)(1),
(2) Date: Jan. 31, 2019

(87) PCT Pub. No.: WO2018/047960
PCT Pub. Date: Mar. 15, 2018

(65) Prior Publication Data
US 2019/0183220 A1    Jun. 20, 2019

(30) Foreign Application Priority Data

Sep. 12, 2016   (JP) .............................. JP2016-196025

(51) Int. Cl.
*A45C 11/00* (2006.01)
*H04M 1/11* (2006.01)
(Continued)

(52) U.S. Cl.
CPC .............. *A45C 11/00* (2013.01); *A45C 13/10* (2013.01); *H04M 1/11* (2013.01); *H05K 5/02* (2013.01);
(Continued)

(58) Field of Classification Search
CPC .............. A45C 11/00; A45C 2011/002; A45C 2011/003; A45C 2200/15;
(Continued)

(56) References Cited

U.S. PATENT DOCUMENTS 6,892,880 B2 *   5/2005   Nieves ................... A45C 11/00
                                                              206/305
8,899,415 B2 * 12/2014   McCosh ................. G06F 1/166
                                                              206/320
(Continued)

FOREIGN PATENT DOCUMENTS

CN          204031231 U     12/2014
CN          204087061 U      1/2015
(Continued)

OTHER PUBLICATIONS

International Search Report in PCT/JP2017/032618.
(Continued)

*Primary Examiner* — Golam Sorowar
(74) *Attorney, Agent, or Firm* — Solaris Intellectual Property Group, PLLC (57) ABSTRACT

Provided is a portable terminal cover, which is configured to surround a portable terminal and a portable terminal case or other retainer in an integrated manner and is continuously usable irrespective of a shape of the portable terminal. Provided is a portable terminal cover including: a portable terminal cover main body portion made of a freely foldable material; and a band portion mounted to the portable terminal cover main body portion, in which the band portion is sandwiched between the portable terminal and a retainer to which the portable terminal is mounted. The portable terminal case or other retainer and the portable terminal can be easily and repeatedly fixed to, attached to, and detached from the portable terminal cover main body portion through the band portion. Further, even when a camera hole is not
(Continued)

formed in the portable terminal cover main body portion, with the band portion, shooting can be performed without a detaching operation under a state in which the portable terminal is mounted to the portable terminal cover.

7 Claims, 7 Drawing Sheets

(51) Int. Cl.
*H05K 5/02* (2006.01)
*A45C 13/10* (2006.01)
*H05K 5/03* (2006.01)

(52) U.S. Cl.
CPC .......... *H05K 5/03* (2013.01); *A45C 2011/002* (2013.01); *A45C 2011/003* (2013.01); *A45C 2013/1015* (2013.01); *A45C 2013/1061* (2013.01)

(58) Field of Classification Search
CPC .............. A45C 2013/025; A45C 11/24; A45C 13/1069; A45C 15/00; A45C 13/30; A45C 11/182; A45C 13/005; A45C 13/20; A45C 1/06; G06F 2200/1633; G06F 1/1626; G06F 1/1628; G06F 1/1613; G06F 1/1632; G06F 1/1635; G06F 1/165; G06F 1/1669; H04M 1/04; H04M 1/185; H04M 1/0214; H04M 1/0283; H04M 1/0202; H04M 1/0216; H04M 1/72527; H04M 1/0235; H04M 1/0245; H04M 1/0254
See application file for complete search history.

(56) References Cited

U.S. PATENT DOCUMENTS

| | | | | |
|---|---|---|---|---|
| 2006/0166720 A1* | 7/2006 | Dixon | ................ | H04B 1/3888 455/575.6 |
| 2008/0283349 A1 | 11/2008 | Taieb | | |
| 2013/0048514 A1* | 2/2013 | Corcoran | ................ | A45C 3/02 206/45.23 |
| 2014/0216971 A1* | 8/2014 | Ashley | ................ | A45C 11/00 206/472 |
| 2015/0111624 A1* | 4/2015 | Peel | ................ | H04B 1/3877 455/575.8 |
| 2016/0277053 A1* | 9/2016 | Wong Chee | ......... | H04B 1/3888 |

FOREIGN PATENT DOCUMENTS

| | | | | |
|---|---|---|---|---|
| JP | 3177647 | | 8/1920 | |
| JP | 2002-000329 | | 1/2002 | |
| JP | 2009-515245 | | 4/2009 | |
| JP | 2012-227905 | | 11/2012 | |
| JP | 2015-046712 | | 3/2015 | |
| JP | 3197709 | | 6/2015 | |
| JP | 2015-163009 | | 9/2015 | |
| JP | 3200002 | | 10/2015 | |
| KR | 2012-0003539 | | 5/2012 | |
| KR | 2013-0074446 | | 7/2013 | |
| KR | 200469708 Y1 * | | 11/2013 | ............. A45C 11/00 |

OTHER PUBLICATIONS

EnglishLanguage Machine Translation of JP 3197709.
English Language Machine Translation of JP 3177647.
English Language Abstract of JP 2015-163009.
English Language Abstract of JP 2015-046712.
English Language Machine Translation of JP 3200002.
English Language Abstract of JP 2002-000329.
Extended European Search Report dated Aug. 23, 2019 in corresponding EP application No. 17848898.7.
English language machine translation of JP 2012-227905.
English language machine translation of KR 2013-0074446.
English language machine translation of KR 2012-0003539.
Extended European Search Report dated Aug. 19, 2019 in corresponding EP application No. 17848898.7.
First Office Action dated Jul. 3, 2020 in corresponding Chinese patent application No. 201780047807.2 and English translation.
English language abstract for CN 204087061U.
English language abstract for CN 204031231U.

* cited by examiner

PORTABLE TERMINAL COVER FOR SURROUNDING A PORTABLE TERMINAL AND A PORTABLE TERMINAL CASE OR OTHER RETAINER IN AN INTEGRATED MANNER

TECHNICAL FIELD

The present invention relates to a portable terminal cover.

BACKGROUND ART

A portable terminal cover is often used for a portable terminal. Typical examples of the portable terminal cover include a case type such as a soft case and a hard case, and a notebook type. The notebook type is described in, for example, Patent Literature 1 described below.

CITATION LIST

Patent Literature

[PTL 1] JP 3197709 U
[PTL 2] JP 3177647 U

SUMMARY OF INVENTION

Technical Problem

There is a problem in that the above-mentioned various types of portable terminal covers are usable only for portable terminals having the same shape in many cases.

Solution to Problem

As a measure to solve the above-mentioned problem, the present invention provides a portable terminal cover including: a portable terminal cover main body portion made of a freely foldable material; and a band portion mounted to the portable terminal cover main body portion, in which the band portion is sandwiched between a portable terminal and a portable terminal case or other retainer to which the portable terminal is detachably mounted. The portable terminal and the portable terminal case or other retainer can be fixed to, attached to, and detached from the portable terminal cover main body portion through the band portion. Further, even when a camera hole is not formed in the portable terminal cover main body portion, with the band portion, shooting can be performed without a detaching operation under a state in which the portable terminal is mounted to the portable terminal cover main body portion.

Herein, the term "retainer" including the term described in CLAIMS refers to not only a retainer configured to fix the portable terminal by holding the entirety of the portable terminal but also a retainer configured to fix the portable terminal or any other electronic devices and the like by holding at least a part of the portable terminal or a part of the electronic device.

Advantageous Effects of Invention

According to the present invention, the portable terminal cover can surround the portable terminal and the portable terminal case or other retainer in an integrated manner and is continuously usable irrespective of shapes of the portable terminal in terms of a size, an operation button, a camera position, and the like.

DESCRIPTION OF EMBODIMENTS

The present invention is described below by way of embodiments, however the present invention is by no means limited by those embodiments.

Figure 1:
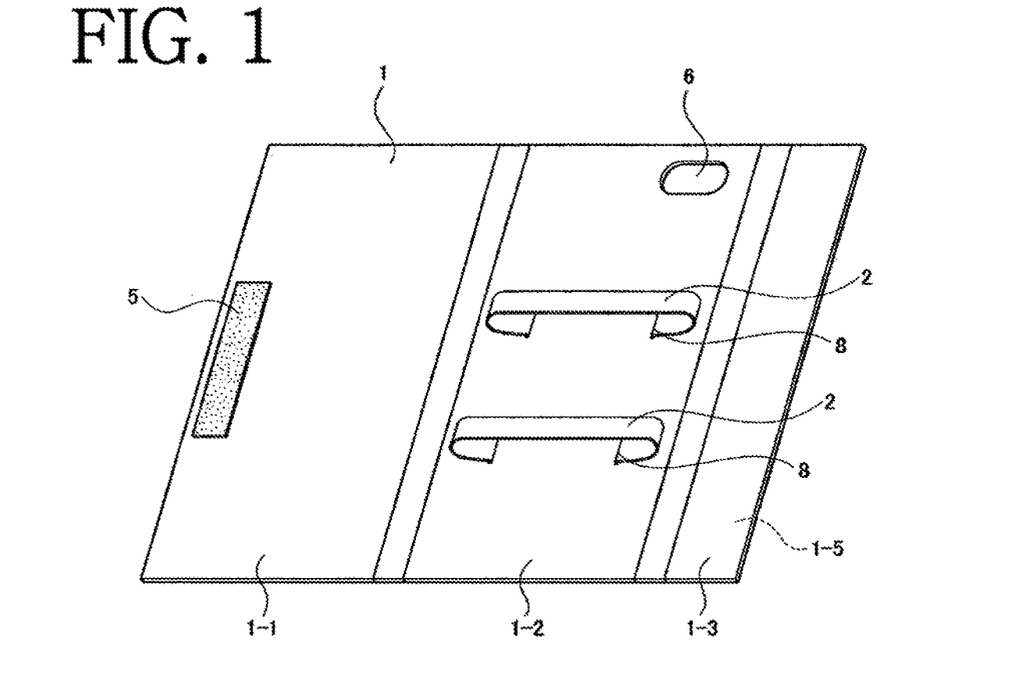
FIG. 1 is an inner perspective view for illustrating a portable terminal cover according to a first embodiment of the present invention.

FIG. 1 is a view for illustrating a spread state of a portable terminal cover main body portion 1 of a side-open notebook type according to a first embodiment of the present invention.

The portable terminal cover main body portion 1 includes, for example, an inner left surface 1-1, an inner right surface 1-2, a flap portion 1-3, and the like and is used as a folding portable terminal cover. The inner right surface 1-2 is used as a mounting portion for a portable terminal.

The mounting portion includes band portions 2 each configured to mount a portable terminal case 3 or other retainer and a portable terminal 4 (see FIG. 4) to the portable terminal cover main body portion 1. It is preferred that each band portion 2 be arranged at a position at which the band portion 2 is prevented from overlapping operation devices of the portable terminal 4 such as a power button. When there is no fear of impairing functions of the operation devices, the band portion 2 may be arranged at a position of overlapping the operation devices. A hook-and-loop fastener 5 is also provided on an outer back surface 1-5, and is attached to another hook-and-loop fastener 5 for use when the portable terminal cover main body portion 1 is closed. The mounting portion has a main body camera hole 6 and band holes 8 through which the band portion 2 is inserted. Although the inner right surface 1-2 is used as the mounting portion for a portable terminal and the portable terminal cover main body portion 1 is opened leftward with a long side of the portable terminal being a fulcrum, the inner left surface 1-1 may be used as the mounting portion and the portable terminal cover main body portion 1 may be opened rightward. Further, the band portion 2 may be arranged on the mounting portion without forming the band hole 8. The above-mentioned points hold true for other embodiments described later. Common components are hereinafter denoted by the same reference symbols in the drawings, and description thereof is omitted.

The portable terminal cover main body portion 1 is made of, for example, any one of rubber, silicone, cloth, leather, synthetic leather, a synthetic resin, and metal or of a combination thereof. It is only required that the band portion 2 or a band portion 2-1 described later (see FIG. 8) be sandwiched between the portable terminal case 3 or other retainer and the portable terminal 4 (see FIG. 2). The band portion 2 or the band portion 2-1 is made of, for example, any one of rubber, silicone, cloth, a cord, a tape, leather, synthetic leather, a synthetic resin, and metal or of a combination thereof. The band portion 2 may be made of a combination of a plurality of materials. For example, the cover main body portion 1 side may be made of cloth, and the cloth portion may be connected through use of rubber. The above-mentioned points hold true for other embodiments described later.

Figure 2:
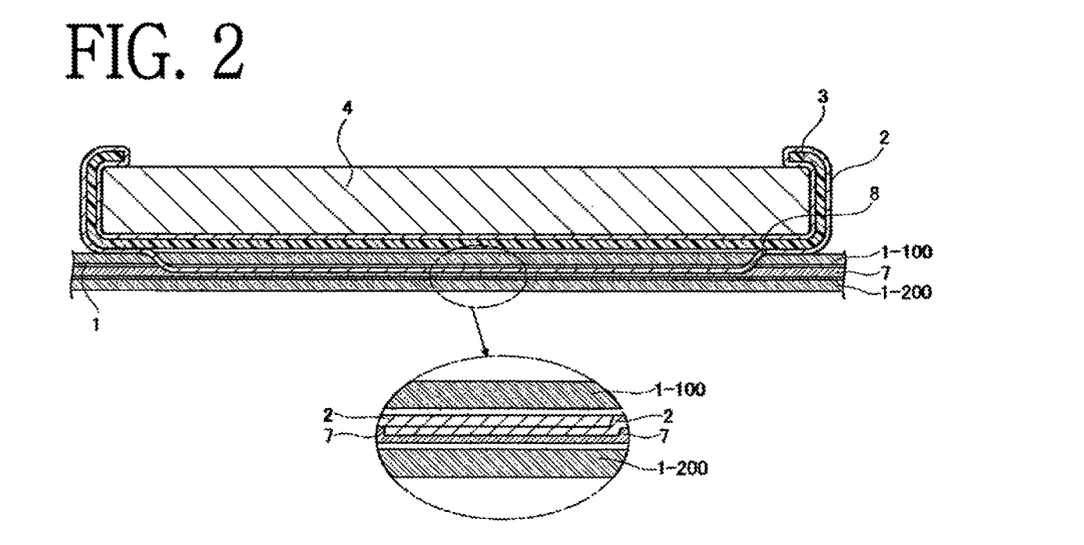
FIG. 2 is a sectional view for illustrating a band portion of the portable terminal cover according to the first embodiment.

FIG. 2 is a partial sectional view for illustrating the band portion 2 of the portable terminal cover main body portion 1, and corresponds to a sectional view taken along the line AA' of FIG. 4 described later (see FIG. 4). The band portion 2 is formed into a shape of wrapping the portable terminal case 3 or other retainer, and is sandwiched between the portable terminal case 3 or other retainer and the portable terminal 4. The portable terminal case 3 or other retainer and the portable terminal 4 are fixed to the portable terminal cover main body portion 1 by the band portions 2, and thus are held in an integrated manner. A portable terminal cover inner portion 1-100, a portable terminal cover outer portion 1-200, a core member 7, and the like are provided, and are fixed to each other at, for example, peripheries and surfaces thereof.

The band holes 8 are formed in the portable terminal cover inner portion 1-100, and the band portion 2 is inserted through the band holes 8. Both ends of the band portion 2 are joined and fixed to each other, and the band portion 2 is fixed to the core member 7 and the like at a plurality of portions. A method of fixing portions of the band portion together or fixing the band portion to the portable terminal cover main body portion 1, the mounting portion, the core member 7, and the like includes, for example, any one of sewing, bonding, adhesion, welding, joining, coupling, engagement, a fastener, and a fixing device or a combination thereof, and the band portion may be fixed at a plurality of portions. Further, the band portion 2 may be fastened, fixed, or detachably fixed. The core member 7 or the like provides effects of preventing the fixed portions of the band portion 2 from being seen on the portable terminal cover inner portion 1-100 or the portable terminal cover outer portion 1-200 so as to keep aesthetic appearance, and protecting the band portion 2 against an external force. The above-mentioned points hold true for other embodiments described later.

Figure 3:
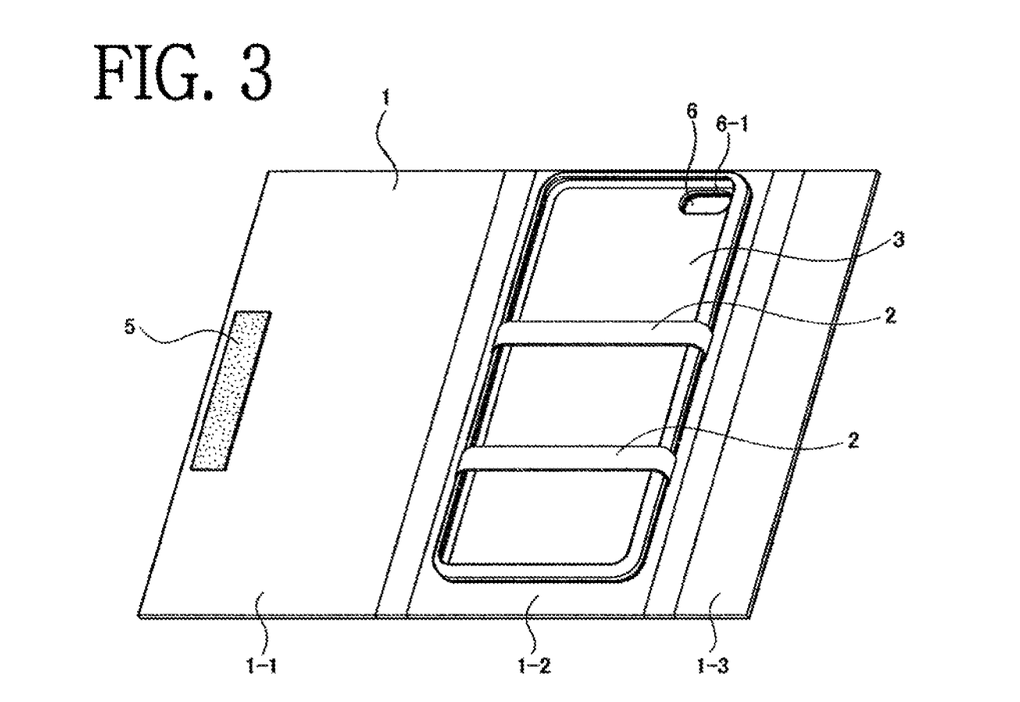
FIG. 3 is an inner perspective view for illustrating a use state of the portable terminal cover according to the first embodiment.

FIG. 3 is a view for illustrating a spread state of the portable terminal cover main body portion 1 of FIG. 1 to which the portable terminal case 3 or other retainer is mounted. The portable terminal case 3 includes, for example, a soft case, a hard case, a retainer for a portable terminal, or the like, which include what are commercially available in general and any other known devices or the like.

First, the portable terminal case 3 or other retainer is mounted to the portable terminal cover main body portion 1. The portable terminal case 3 or other retainer is inserted into a loop of each of the band portions 2 of the inner right surface 1-2 being the mounting portion. At this time, the band portions 2 are positioned on an outer side of the portable terminal case 3 or other retainer. At the time of mounting, a position of the main body camera hole 6 and a position of a case camera hole 6-1 are matched with each other.

Figure 4:
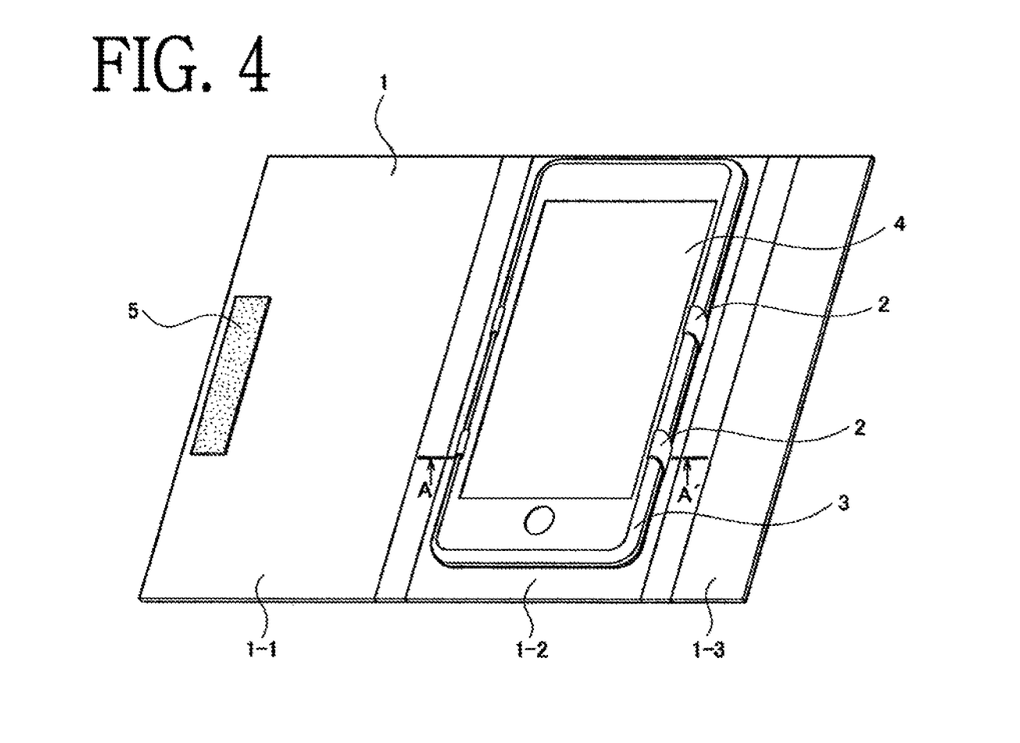
FIG. 4 is an inner perspective view for illustrating a use state of the portable terminal cover according to the first embodiment.

FIG. 4 is a view for illustrating a spread state of the portable terminal cover main body portion 1 of FIG. 3 to which the portable terminal 4 is mounted. Next, the portable terminal 4 is fitted to the portable terminal case 3 or other retainer and the band portions 2 illustrated in FIG. 3 from above. When the portable terminal 4 is fitted to the portable terminal case 3 or other retainer in a way similar to a normal mounting way, the band portions 2 are sandwiched between the portable terminal case 3 or other retainer and the portable terminal 4 to be positioned below the portable terminal 4. Therefore, the band portions 2 do not overlap and obstruct a touch panel display of the portable terminal 4 so that the touch panel display is operable. At the time of mounting of the portable terminal 4, the sandwiched band portions are fixed by being pressed by side surfaces, a back surface, or the like of the portable terminal 4, and thus are reliably integrated with the portable terminal cover main body portion 1.

The portable terminal case 3 or other retainer is not fixed to the portable terminal cover main body portion 1 through bonding, adhesion, or the like, and hence the portable terminal case 3 or other retainer and the portable terminal 4 can be easily and repeatedly attached to and detached from the portable terminal cover main body portion 1 through the band portions. The portable terminal 4 is attachable to and detachable from the portable terminal cover main body portion 1, and hence there is easily allowed use of two forms of a cover, specifically, a case form in which the portable terminal 4 is mounted to the portable terminal case 3 or other retainer and a notebook form in which the portable terminal 4 is mounted to the portable terminal cover main body portion 1. Further, the portable terminal cover according to the present invention is adaptable to various types of portable terminals that differ from each other in size, operation button, camera position, and the like, and hence is continuously usable.

Further, even when a size or a thickness of the portable terminal changes, the portable terminal cover according to the present invention is adaptable to such change as long as the portable terminal can be mounted to a retainer through the band portion. Thus, a universal design can be attained.

First Embodiment

Figure 5:
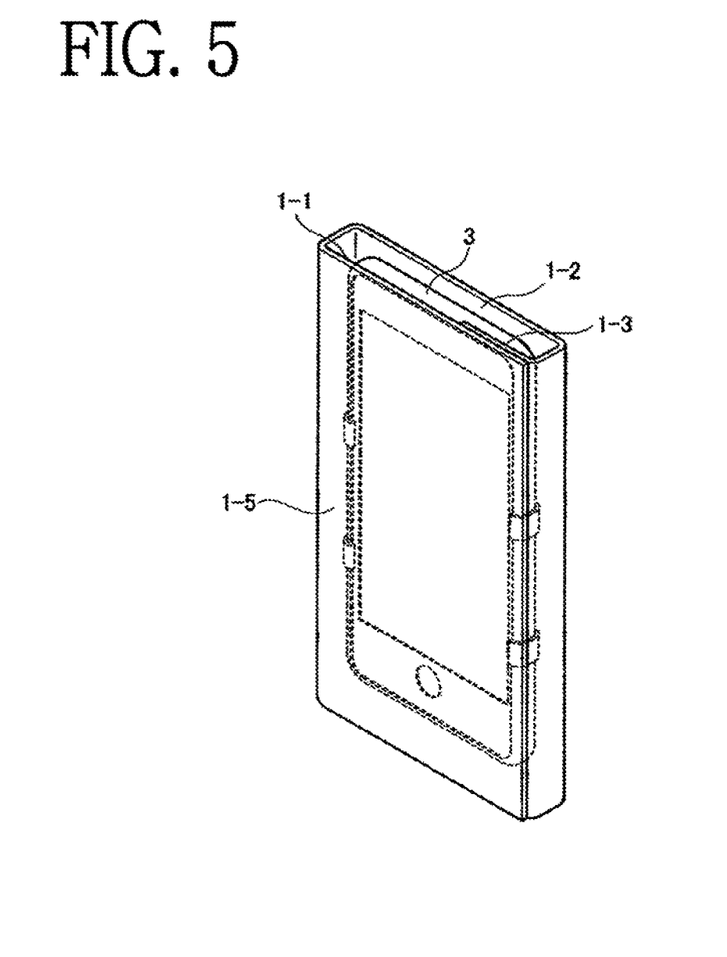
FIG. 5 is an outer perspective view for illustrating a closed state of the portable terminal cover according to the first embodiment.

FIG. 5 is a view for illustrating a closed state of the portable terminal cover main body portion 1 according to the first embodiment. The portable terminal cover main body portion 1 is closed under a state in which another surface of the mounting portion is folded. The flap portion 1-3 is folded over the inner right surface 1-2, and the inner left surface 1-1 is folded to be laid on flap portion 1-3. Then, the portable terminal cover main body portion 1 is closed by a fastener such as the hook-and-loop fastener 5. The flap portion 1-3 is laid inside the outer back surface 1-5, and is not laid on the outer back surface 1-5.

As a result, decoration is easily made on the entire outer back surface 1-5. The closing method is not limited to the above-mentioned method.

Second Embodiment

Figure 6:
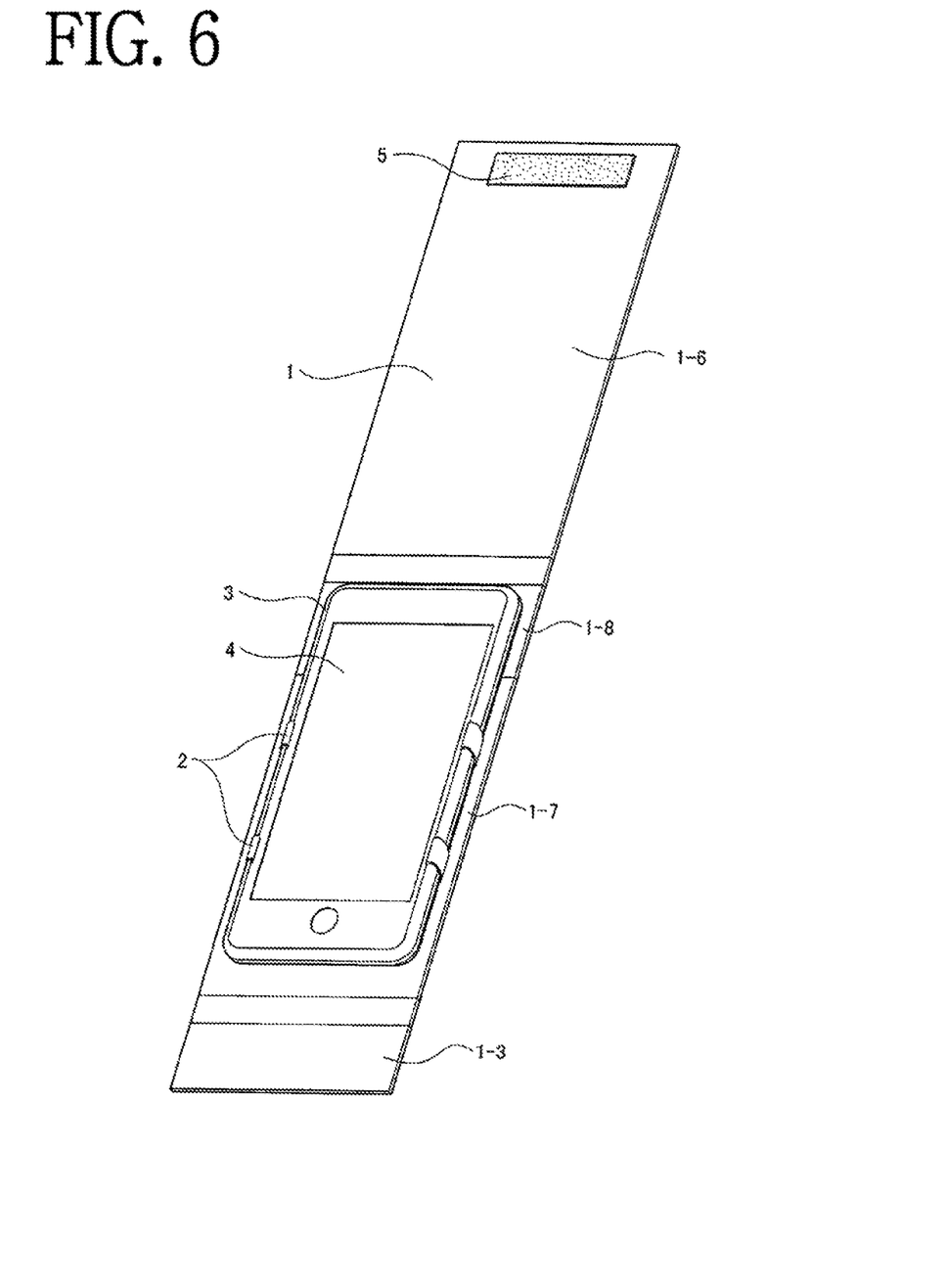
FIG. 6 is an inner perspective view for illustrating a use state of a portable terminal cover according to a second embodiment of the present invention.

FIG. 6 is a view of a spread state of the portable terminal cover main body portion 1 of an up-and-down-open notebook type according to a second embodiment of the present invention. The portable terminal cover main body portion 1 according to the second embodiment has a shape obtained by changing that according to the first embodiment into an up-and-down-open type, and is folded in an up-and-down direction. Although an inner lower surface 1-7 is used as the mounting portion and the portable terminal cover main body portion 1 is opened upward with a short side of the portable terminal being a fulcrum, an inner upper surface 1-6 may be used as the mounting portion and the portable terminal cover main body portion 1 may be opened downward. The inner lower surface 1-7 includes a bending portion 1-8. The bending portion 1-8 is formed below the above-mentioned camera hole. During use of a camera, the camera hole is exposed by bending the inner lower surface 1-7 from the bending portion 1-8 so that shooting can be performed (see FIG. 7). An entire part of the bending portion 1-8 corresponding to an upper part of the portable terminal 4 may be bent, or only a part of the bending portion 1-8 may be bent. When the inner lower surface 1-7 is made of a soft material such as cloth, the bending portion 1-8 is not required.

Third Embodiment

Figure 7:
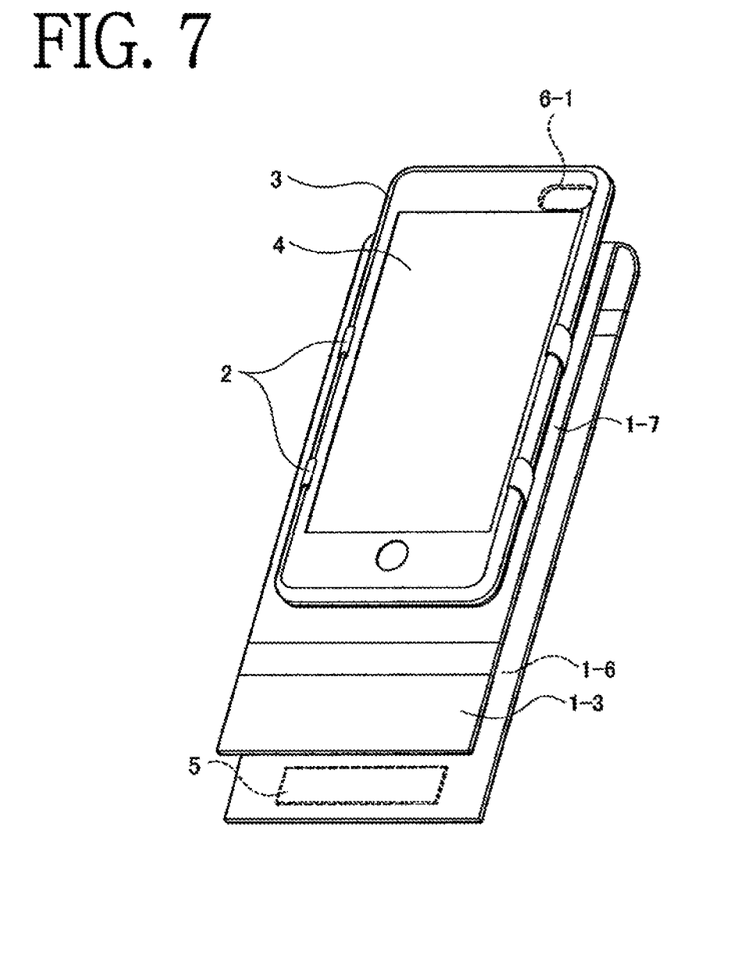
FIG. 7 is an inner perspective view for illustrating a use state of a portable terminal cover according to a third embodiment of the present invention.

FIG. 7 is a view for illustrating a camera use example in a case of the portable terminal cover main body portion 1 of the up-and-down-open notebook type of FIG. 6 according to a third embodiment of the present invention. Even when the main body camera hole 6 is not formed in the portable terminal cover main body portion 1, shooting can be performed without a detaching operation under a state in which the portable terminal case 3 or other retainer and the portable terminal 4 are mounted to the portable terminal cover main body portion 1. When the bending portion 1-8 of the mounting portion, which is illustrated in FIG. 6, is bent backward, the case camera hole 6-1 and a camera portion of the portable terminal 4 can be easily exposed from the portable terminal cover main body portion 1 even without the main body camera hole 6, and hence shooting can be performed under this state. The main body camera hole 6 is not formed, and a part of the portable terminal cover main body portion 1 corresponding to the camera portion of the portable terminal 4 is configured to be bendable. Similarly, also in the side-open notebook type of FIG. 4, shooting can be performed by only bending the upper part of the portable terminal cover main body portion 1 backward.

Further, different ways are as follows. The main body camera hole 6 is not formed in the side-open notebook type of FIG. 4, and the band portions 2 expand and contract when the portable terminal case 3 or other retainer, to which the portable terminal 4 is fitted, is pushed upward from below by a thumb or the like. As a result, the portable terminal 4 is slid upward, and similarly to the case illustrated in FIG. 7, the case camera hole 6-1 and the camera portion of the portable terminal 4 are exposed to the outside from the upper part of the portable terminal cover main body portion 1 so that shooting can be performed. Also in the up-and-down-open notebook type of FIG. 6, shooting can be performed by bending backward a portion between the inner upper surface 1-6 and the inner lower surface 1-7 being the mounting portion, or similarly pushing the portable terminal 4 upward with a configuration in which the inner upper surface 1-6 is used as the mounting portion and the hook-and-loop fastener 5 is provided on the back surface. Depending on materials and the like of the band portion and the portable terminal cover main body portion 1, the portable terminal cover main body portion 1 can be used by any one of the ways, and thus can be applied to various types of portable terminals that differ from each other in shape, camera position, and the like.

In the present invention, the portable terminal case 3 or other retainer is not fixed to the portable terminal cover main body portion 1 through bonding, adhesion, or the like. Accordingly, when it is required that the camera portion of the portable terminal 4 covered with the portable terminal cover main body portion 1 be exposed to the outside of the portable terminal cover main body portion 1 in order to perform shooting, the part of the portable terminal cover main body portion 1 corresponding to the camera portion of the portable terminal 4 can be folded at the bending portion 1-8, or the portable terminal case 3 or other retainer can be pushed upward from below so as to be slid. Further, the main body camera hole 6 is not formed in the portable terminal cover main body portion 1 so that a camera lens of the portable terminal 4 is covered. Thus, for example, effects of preventing contamination of the camera lens and protecting the camera lens can be obtained.

Fourth Embodiment

Figure 8:
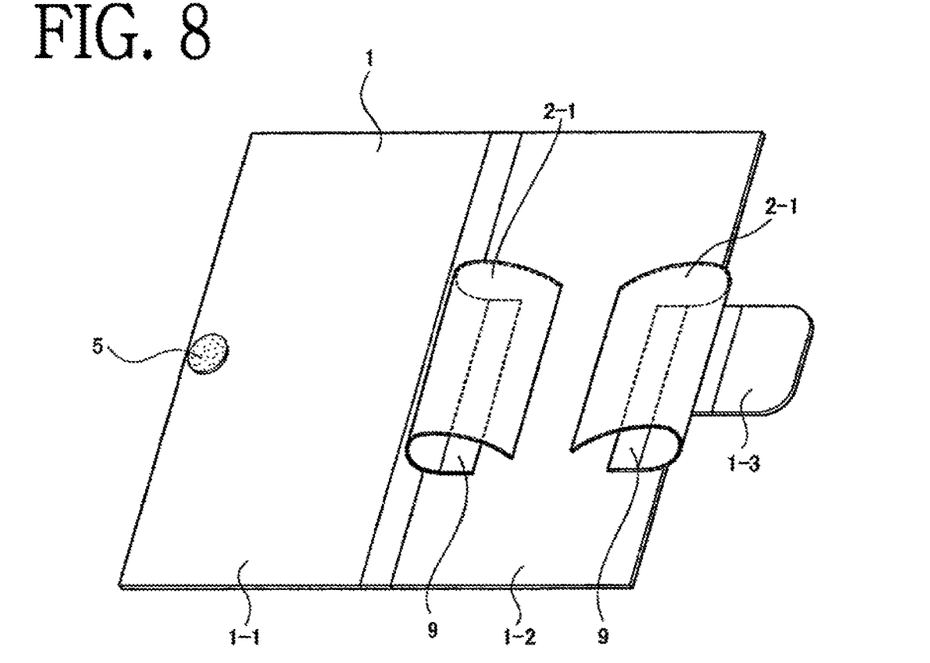
FIG. 8 is an inner perspective view for illustrating a use state of a portable terminal cover according to a fourth embodiment of the present invention.

FIG. 8 is a view for illustrating a spread state of a portable terminal cover main body portion according to a fourth embodiment of the present invention including a modification of the band portion 2 according to the first embodiment to the third embodiment. A band portion 2-1 is different from the band portion 2 in shape and the like, but a material example, a fixing method, and the like for the band portion 2-1 are the same as those for the band portion 2 according to the first embodiment to the third embodiment.

No band hole 8 is formed, and only an inner right or inner left side of the band portion 2-1 is directly fixed by a fixing portion 9. However, right and left two band portions 2-1 may be joined into one member, and, for example, a center of the two band portions 2-1 may be fixed by the fixing portion 9. Further, the band portion 2-1 may be formed of the band portion 2, or a combination of the band portion 2 and the band portion 2-1 may be adopted (see FIG. 10). Although the band portions 2-1 of FIG. 8 are configured to hold the portable terminal at right and left long sides of the portable terminal, the band portions 2-1 may be provided to hold upper and lower short sides of the portable terminal, any one of upper, lower, right, and left sides of the portable terminal, or a combination of a plurality of sides among the upper, lower, right, and left sides. The flap portion 1-3 is provided on only a part of one side of the portable terminal. In FIG. 8, the two band portions 2-1 are illustrated, but a configuration including a single band portion 2-1 may be adopted. Further, the two band portions 2 may differ from each other in size, position, and the like.

Figure 9:
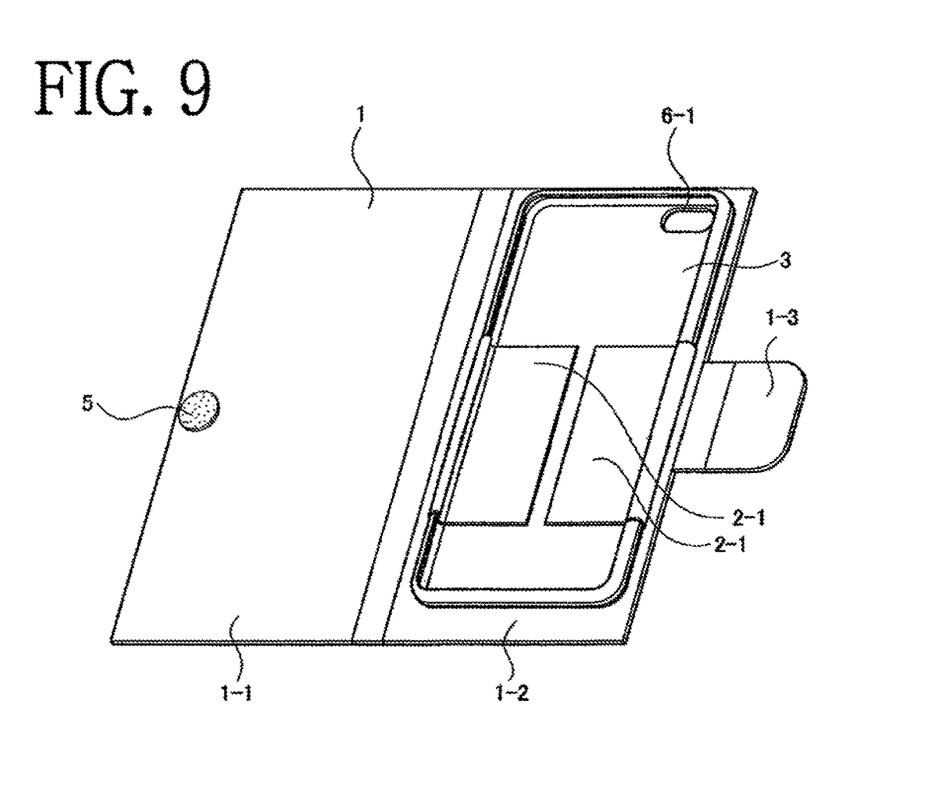
FIG. 9 is an inner perspective view for illustrating a use state of the portable terminal cover according to the fourth embodiment to which a case is mounted.

FIG. 9 is a view for illustrating a spread state of the portable terminal cover main body portion of FIG. 8 to which the portable terminal case 3 or other retainer is mounted. The band portions 2-1 of FIG. 8 are raised and laid on the portable terminal case 3 or other retainer in conformity to the portable terminal case 3 or other retainer, and then the portable terminal 4 is fitted into the portable terminal case 3 or other retainer from above. In the first embodiment to the third embodiment, the band portion 2 wraps an entire girth of the portable terminal case 3 or other retainer. However, in FIG. 9, the band portion 2-1 has such a structure as to partially wrap the girth of the portable terminal case 3 or other retainer. The band portion 2-1 can also provide the same effects as those of the band portion 2 in the first embodiment to the third embodiment, and is adaptable to the portable terminals 4 that differ from each other in shape and the like such as size.

Fifth Embodiment

Figure 10:
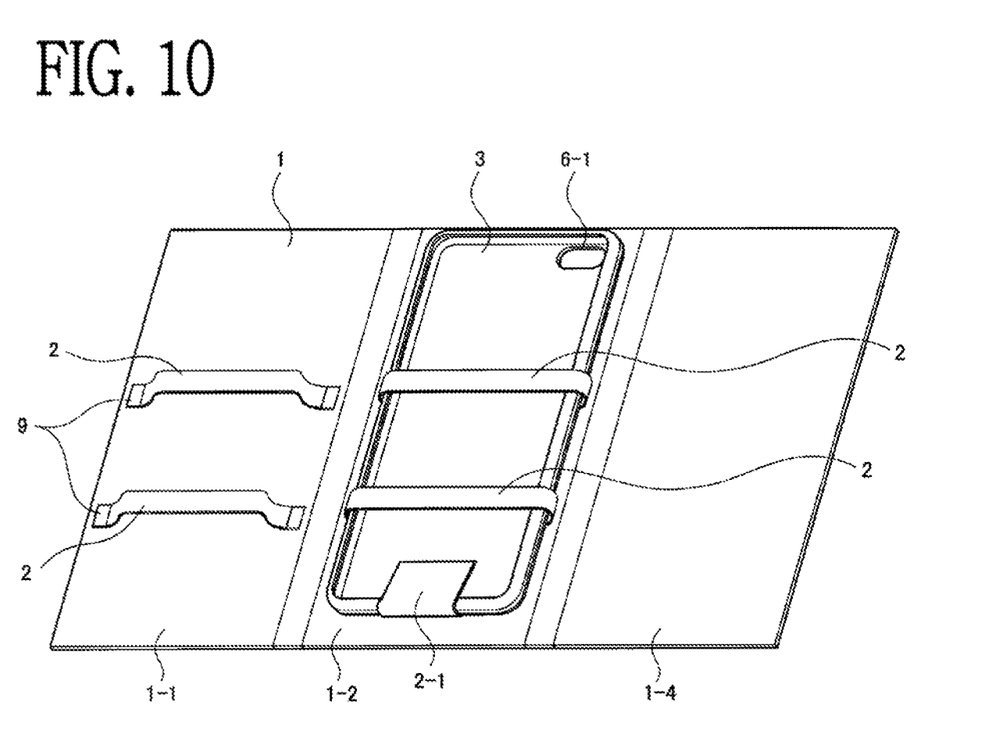
FIG. 10 is an inner perspective view for illustrating a use state of a portable terminal cover according to a fifth embodiment of the present invention.

FIG. 10 is a view for illustrating a portable terminal cover according to a fifth embodiment of the present invention. In the fifth embodiment, the band portions 2 are also provided on the inner left surface 1-1 so that two portable terminals can be mounted to the portable terminal cover main body portion 1. In the fifth embodiment, the portable terminal can be mounted to each of the inner left surface 1-1 and the inner right surface 1-2. However, for example, the band portions 2 may be provided on both sides of the inner left surface 1-1 or the inner right surface 1-2 so that the portable terminals can be mounted to the both sides.

Modification Example

The embodiments of the present invention are described above, but the present invention is not limited to those embodiments, and the present invention can be implemented in various modes without departing from the gist thereof. For example, the following modification is possible.

An outer surface and an inner surface of the portable terminal cover main body portion 1 according to the first embodiment to the fifth embodiment may have various patterns, decorations, functions, and the like.

For example, a pocket, a display protector, a contamination preventing member, or a dirt wiper may be provided, or the portable terminal cover main body portion 1 may have functions of the above-mentioned members.

In the first embodiment to the fifth embodiment, the portable terminal cover main body portion 1 is of the right-open or left-open horizontal type or the up-and-down-open vertical type. However, for example, the portable terminal cover main body portion 1 may be of a type including only the mounting portion, a type including a plurality of surfaces, a bifold type, a multifold type, or a type without the flap portion 1-3. Further, although the portable terminal cover main body portion 1 has a flat surface, but, for example, a three-dimensional, deformed, decorative surface, or the like may be used as the portable terminal cover main body portion 1, and the band portion, the mounting portion with the band portion, or the like may be provided. For example, the portable terminal cover main body portion 1 may be shaped into an animal, a food, a vehicle, or the like, made as a stuffed toy, or the like, or shaped into or made as any other possible shapes and materials or the like. Further, for example, the mounting portion with the band portion and the core member 7, which are modified in size and shape, may be fixed to the portable terminal cover inner portion 1-100 or the like.

In the first embodiment to the fifth embodiment, the portable terminal cover is exemplified, but the present invention may be applied to, for example, a tablet device or any other electronic devices and the like.

In the first embodiment to the fifth embodiment, description is made of the band portion as illustrated in the drawings, but the present invention is not limited thereto. The band portions may be provided as any number of pieces, sheets, or plies, and have any shape such as linear, curved, deformed, patterned, or decorative shapes.

The band portions may be provided in vertical, horizontal, oblique, parallel, or crossing arrangement or combined arrangement. For example, the band portions may be arranged in parallel to each other at two corners so as to extend obliquely from the upper side and the lower side of the portable terminal to the side surfaces. Alternatively, the band portions may be provided in both vertical and horizontal arrangement, obliquely crossing arrangement, or combined arrangement. For example, in the first embodiment to the fifth embodiment, the two band portions 2 are provided, but a single band portion may be horizontally laid in parallel on the mounting portion, and fixed in a crossing state on a back side, an inner side, or the like of the mounting portion.

Alternatively, the portable terminal cover main body portion 1 and the mounting portion may be made of the same material as that for the band portion, the band portion and the portable terminal cover main body portion 1 may be formed integrally with each other, or a part of the portable terminal cover main body portion 1 or the mounting portion may be formed of the band portion. For example, two parallel grooves may be formed in, for example, the portable terminal cover inner portion 1-100 of the mounting portion so as to extend horizontally and have the same width as that of the band portion, and a portion between the grooves may be drawn forward to be used as the band portion 2. Further, two parallel grooves each having a large horizontal width may be formed, and one vertical groove or the like may be formed at a center of the two parallel grooves. Then, portions defined by the grooves may be formed into right and left two band portions like the band portions 2-1 of FIG. 8, and be similarly drawn forward to be used as the band portions 2-1 as illustrated in FIG. 9. Any methods and shapes, or the like other than the above-mentioned methods and the shapes may be adopted for the band portions.

In the first embodiment to the fifth embodiment, description is made of the mounting portion and the band portion as illustrated in the drawings. However, for example, the band portion may be provided on each of two surfaces, specifically, the mounting portion and another surface, and the another surface may be folded backward so that the band portion is used as a fall preventing band or the like configured to allow insertion of hand. Alternatively, another surface may be used as two surfaces of the mounting portion, and a display protection or the like may be arranged between the two surfaces so that a plurality of portable terminals or the like are mounted. Alternatively, for example, a plurality of or a plurality of kinds of band portions may be provided, and the band portions may be selectively used in accordance with the portable terminal. Further, a fastener configured to be capable of adjusting a length of the band portion may be provided on the band portion, the portable terminal cover main body portion 1, or the like, and the length of the band portion may be adjusted for use by the fastener for adjustment in accordance with the shape and the like of the portable terminal 4. The band portion may fix the portable terminal at any one of right, left, upper, lower portions, and the like thereof or at several portions. The band portion may be increased in size and fixed at, for example, three portions so that the band portion is formed into a single pocket shape.

In the first embodiment to the fifth embodiment, the band portion is formed into the above-mentioned shape, but the band portion may be entirely continuous or intermittent. For example, when the band portion is formed into a loop, both ends of the band portion may overlap each other, be arranged side by side, be arranged apart from each other, or be fixed with a variable distance between the ends. Further, the band portion may be formed into, for example, a seamless ring shape. The band portion need not be inserted through the band holes 8, and one end of the band portion may be fixed to the core member 7, the portable terminal cover main body portion 1, or the like. When the band portion is formed into a looped shape, the band portion may be fixed or need not be fixed. For example, the band portion may be detachably fixed to the portable terminal cover main body portion 1, the mounting portion, or the like by a fixing device or the like. For example, under a state in which the band portion is inserted through the band holes 8 without being formed into a loop and without being fixed by the fixing portion 9 or the like, the band portion can be used while allowing fitting of the portable terminal 4 as illustrated in FIG. 9. Alternatively, for example, without forming the band hole 8, a sheet, cloth, the core member 7, or the like may be bonded to and over the band portion through bonding, an adhesive, sewing, or the like so that the band portion is fixed to the mounting portion.

In the first embodiment to the fifth embodiment, the band portion has a structure of surrounding a girth of the portable terminal case 3 or other retainer or wrapping even a bottom surface of the portable terminal case 3 or other retainer. However, for example, the band portion may wrap only a part, an edge, or a side surface of the portable terminal case 3 or other retainer. For example, a retainer or a protruding member, which is made of metal and bent in conformity to the shape, may be prepared as the band portion, and may be configured to fasten the part or the edge of the portable terminal case 3 or other retainer. Further, for example, the band portion hole 8 may also be formed in a back surface of the portable terminal case 3 or other retainer, and the band portion 2 may be inserted through the portable terminal case 3 or other retainer to be fastened to the portable terminal cover main body portion 1.

In the first embodiment to the fifth embodiment, the hook-and-loop fastener 5 is used as the method of closing the portable terminal cover main body portion 1, but other closing methods, various fasteners, or the like may be adopted. Further, the fastener or the like need not be provided.

In the first embodiment to the fifth embodiment, the core member 7, the portable terminal cover outer portion 1-200, and the like are provided, but the core member 7, the portable terminal cover outer portion 1-200, or the like may be omitted. Further, the core member 7, the portable terminal cover outer portion 1-200, and the like may be fixed to the portable terminal cover inner portion 1-100 and the like or need not be fixed thereto. Alternatively, the core member 7 or the like may be modified in size, shape, arrangement position, and the like, may include the band portion and be fixed on the mounting portion or the like. The core member 7 or the like need not be provided at a portion between surfaces, a portion to be bent, or the like.

In the first embodiment to the fifth embodiment, the band holes 8 are formed only in the portable terminal cover inner portion 1-100 or not formed, but the band holes 8 may also be formed in the portable terminal cover outer portion 1-200 or the like to allow insertion of the band portion. The band holes 8 may be formed at any number of portions, in various shapes, and at any positions, and the band portion may be inserted through several portions.

A shape of the band hole 8 may be, for example, a circular shape, a linear shape, a curved shape, or a combination thereof. In addition, when the band portion is arranged horizontally as illustrated in FIG. 1, the band portion may be wide opened in the up-and-down direction. When the band portion is arranged vertically, the band portion may be wide opened in a right-and-left direction. The band portion, the mounting portion with the band portion or the like may be laid in a looped shape, and a position of the band portion, the mounting portion with the band portion, or the like may be moved in the up-and-down direction and the right-and-left direction so that the band portion, the mounting portion with the band portion or the like is fastened or the like to a desired use position by a movable fastener, a detachable fixing device, or the like. Further, without forming the band hole 8, the band portion, the mounting portion with the band portion or the like may be moved, fastened, or the like by the above-mentioned method.

In the first embodiment to the fifth embodiment, the band holes 8 or the band portions are provided directly in the portable terminal cover main body portion 1.

However, a looped member made of, for example, rubber, silicone, cloth, a tape, a cord, a synthetic resin, or metal may be provided on the mounting portion as the indirect band hole 8 so as to allow insertion and fixation of the band portion. Specifically, the indirect band hole 8 and the band portion may be provided in the portable terminal cover main body portion 1.

REFERENCE SIGNS LIST

1 portable terminal cover main body portion of present invention, 1-1 inner left surface, 1-2 inner right surface, 1-3 flap portion, 1-4 inner additional surface, 1-5 outer back surface, 1-6 inner upper surface, 1-7 inner lower surface, 1-8 bending portion, 1-100 portable terminal cover inner portion, 1-200 portable terminal cover outer portion, 2 band portion, 2-1 band portion, 3 portable terminal case, 4 portable terminal, 5 hook-and-loop fastener, 6 main body camera hole, 6-1 case camera hole, 7 core member, 8 band hole, 9 fixing portion

The invention claimed is:

1. A portable terminal cover, comprising:
   a cover main body portion that has a mounting area for mounting a portable terminal and is made of a freely foldable material; and
   a band portion having one or more ends, the band portion being partially mounted to the mounting area of the cover main body portion, so that at least one end, of the one or more ends of the band portion, is not directly fastened, fixed or detachably fixed to the main body portion and partially wraps a girth of a retainer,
   wherein the band portion is configured to be sandwiched between the portable terminal and the retainer to which the portable terminal is fixed,
   the retainer having side surfaces and a back surface connected to the side surfaces,
   such that the band portion is sandwiched between the side surfaces and the back surface of the retainer and the portable terminal so that the portable terminal is fixed to the retainer.

2. The portable terminal cover according to claim 1, wherein the band portion is made of rubber.

3. The portable terminal cover according to claim 1, wherein the band portion is made of cloth.

4. The portable terminal cover according to claim 1, wherein the cover main body portion and the retainer are movable relatively to each other, and enable exposure of a camera provided in the portable terminal.

5. The portable terminal cover according to claim 1, wherein the cover main body portion is deformable, and enables exposure of a camera provided in the portable terminal.

6. The portable terminal cover according to claim 1, wherein the cover main body portion is configured to enable mounting of a plurality of portable terminals.

7. The portable terminal cover according to claim 1, wherein the cover main body portion has a hole, and wherein the band portion is inserted into the hole.

\* \* \* \* \*

UNITED STATES PATENT AND TRADEMARK OFFICE
CERTIFICATE OF CORRECTION

PATENT NO. : 11,272,769 B2
APPLICATION NO. : 16/322197
DATED : March 15, 2022
INVENTOR(S) : Ken Takada It is certified that error appears in the above-identified patent and that said Letters Patent is hereby corrected as shown below:

On the Title Page

Item (30), titled "Foreign Application Priority Data", should be corrected to read:
Mar. 13, 2017   (JP)................ JP2017-047224
Sep. 12, 2016   (JP)................ JP2016-196025

Signed and Sealed this
Thirty-first Day of May, 2022

Katherine Kelly Vidal
*Director of the United States Patent and Trademark Office*